(12) United States Patent
Hughes et al.

(10) Patent No.: US 7,184,730 B2
(45) Date of Patent: Feb. 27, 2007

(54) AUTOMATIC GAIN CONTROL SYSTEM HAVING A WIDE RANGE OF CONTINUOUS GAIN CONTROL

(75) Inventors: James David Hughes, Boynton Beach, FL (US); Lynn R. Freytag, Deerfield Beach, FL (US); John Richard Oakley, Round Rock, TX (US)

(73) Assignee: Motorola, Inc., Schaumburg, IL (US)

( * ) Notice: Subject to any disclaimer, the term of this patent is extended or adjusted under 35 U.S.C. 154(b) by 603 days.

(21) Appl. No.: 10/138,681

(22) Filed: May 3, 2002

(65) Prior Publication Data

US 2003/0207675 A1 Nov. 6, 2003

(51) Int. Cl.
*H04B 1/06* (2006.01)

(52) U.S. Cl. .............. 455/240.1; 455/241.1; 455/250.1; 455/340; 375/345

(58) Field of Classification Search .......... 455/232.1, 455/234.1, 240.1, 241.1, 245.1, 249.1, 250.1, 455/230, 334, 338, 339, 340, 341; 375/345
See application file for complete search history.

(56) References Cited

U.S. PATENT DOCUMENTS

| | | | | |
|---|---|---|---|---|
| 5,457,811 A | * | 10/1995 | Lemson ............... | 455/67.11 |
| 6,088,583 A | * | 7/2000 | Shimizu et al. ......... | 455/235.1 |
| 6,104,919 A | * | 8/2000 | Lyall et al. ............... | 455/249.1 |
| 6,172,559 B1 | * | 1/2001 | Yamaguchi ............... | 330/51 |
| 6,175,746 B1 | * | 1/2001 | Nakayama et al. ....... | 455/552.1 |
| 6,212,244 B1 | * | 4/2001 | Davidovici et al. ......... | 375/345 |
| 6,510,188 B1 | * | 1/2003 | Isaksen et al. ............. | 375/345 |
| 6,573,782 B2 | * | 6/2003 | Barrett et al. ............. | 329/315 |
| 6,625,433 B1 | * | 9/2003 | Poirier et al. ............ | 455/232.1 |
| 6,646,500 B2 | * | 11/2003 | Li et al. ..................... | 329/318 |
| 2001/0053680 A1 | * | 12/2001 | Yamanaka et al. ....... | 455/232.1 |
| 2002/0137488 A1 | * | 9/2002 | Mitama ..................... | 455/324 |
| 2003/0186665 A1 | * | 10/2003 | Black et al. ............. | 455/240.1 |

* cited by examiner

*Primary Examiner*—Edward F. Urban
*Assistant Examiner*—Nhan T. Le
(74) *Attorney, Agent, or Firm*—Charles W. Bethards

(57) ABSTRACT

An automatic gain control system (100) and methods thereof for a receiver for providing a wide range of continuous gain control has been discussed. The AGC includes an input stage (120) for providing an indication of a strength of a received signal; an attenuator stage (107) operable to switch a fixed amount of attenuation for the received signal; a variable attenuator (109) to provide a variable amount of attenuation for said received signal, and a controller (135) responsive to said indication for providing a variable control signal (145) to the variable attenuator; wherein the controller concurrently changes the variable control signal to change in the opposite direction the variable amount of attenuation by approximately the fixed amount of attenuation whenever the attenuator stage is switched, thereby extending the range of continuous gain control beyond the range of the variable attenuator.

20 Claims, 5 Drawing Sheets

AUTOMATIC GAIN CONTROL SYSTEM HAVING A WIDE RANGE OF CONTINUOUS GAIN CONTROL

FIELD OF THE INVENTION

This invention relates in general to communication receivers and more specifically to an automatic gain control system demonstrating accurate continuous gain control over a wide range.

BACKGROUND OF THE INVENTION

Automatic gain control or AGC systems are known and widely used. However present communications systems being developed and proposed, such as UMTS (Universal Mobile Telephone Systems) also known as WCDMA (Wideband Code Division Multiple Access) when referring to the air interface, are considering relatively high data rates with complex modulation schemes and channel coding schemes each of which is expected to place very stringent demands on the overall AGC system that is used for receivers that will be deployed in these systems. Current AGC systems have suffered from one or more problems such as limited control range, limited accuracy, slow acquisition times, or discontinuous gain control characteristics any or all of which can be a serious problem for a WCDMA receiver.

Thus, what is needed is an apparatus and corresponding methods of automatic gain control that do not suffer from these problems and that will be compatible with new receivers for systems such as UMTS or WCDMA.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present invention.

DETAILED DESCRIPTION OF PREFERRED EMBODIMENT

In overview form the present disclosure concerns communications systems and equipment that provide service to communications units or more specifically user thereof operating therein. More particularly various inventive concepts and principles embodied in apparatus and methods for providing high performance automatic gain control systems with extended range and accuracy for receivers within such systems are discussed and described. The systems and receivers of particular interest are those being developed and deployed such as advanced GPRS systems or UMTS/WCDMA systems and the like as well as extensions, evolutions and so forth for such systems and equipment operating therein.

As further discussed below various inventive principles and combinations thereof are advantageously employed to extend the range of accurate and continuous automatic gain control for an AGC system that is particularly advantageously utilized within an exemplary WCDMA receiver, thus alleviating various problems associated with known AGC systems while still providing an autonomous and low power version of an AGC system suitable for the high data rate complex modulation formats of these receivers provided these principles or equivalents thereof are utilized.

The instant disclosure is provided to further explain in an enabling fashion the best modes of making and using various embodiments in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It is further understood that the use of relational terms, if any, such as first and second, top and bottom, and the like are used solely to distinguish one from another entity or action without necessarily requiring or implying any actual such relationship or order between such entities or actions. Much of the inventive functionality and many of the inventive principles are best implemented with or in software programs or instructions and integrated circuits (ICs) such as custom or semi-custom ICs like application specific ICs. It is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation. Therefore further discussion of such software and ICs, if any, will be limited to the essentials with respect to the principles and concepts of the preferred embodiments, in the interest of brevity and minimization of any risk of obscuring the principles and concepts in accordance with the present invention.

Figure 1:
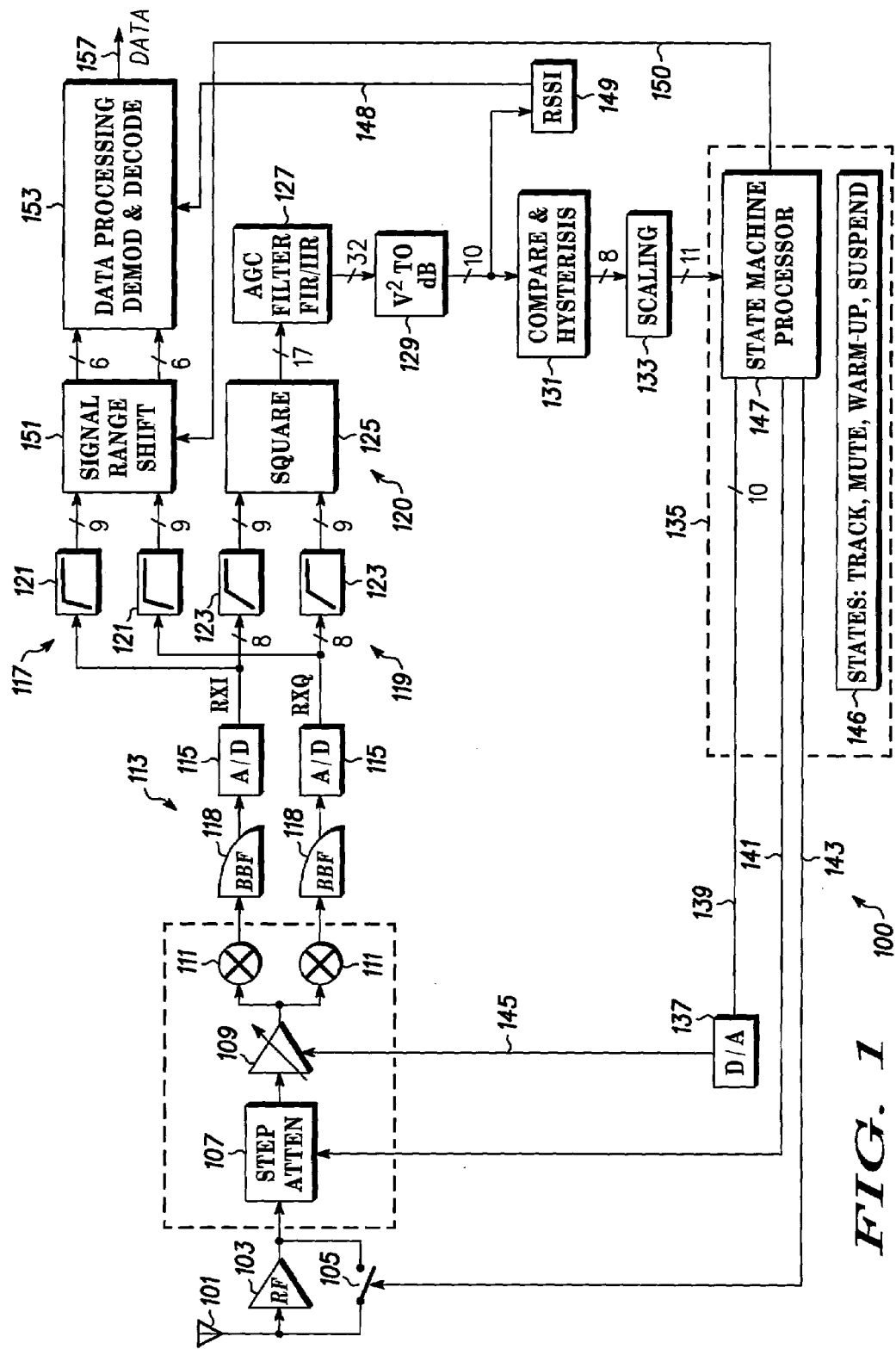
FIG. 1 depicts, in an exemplary receiver with a preferred embodiment of an automatic gain control (AGC) system according to the present invention.

Referring to FIG. 1 an exemplary receiver, preferably a receiver for a WCDMA also known as UMTS signal or other complex modulation high data rate signals, with a preferred embodiment of an automatic gain control (AGC) system 100 will be described and discussed. The receiver includes or is inter-coupled to a generally known antenna 101 at a radio frequency (RF) amplifier 103. This amplifier and associated circuitry includes a bypass switch arrangement 105 that allows the amplifier to be controllably used as an attenuator stage operable to switch a fixed amount, such as nominally in one embodiment 18 dB, of attenuation or more specifically forego or add by switching in or out that amount of attenuation or out or in that amount of gain for the received signal. Also preferably included, but not shown, with the RF amplifier is various selectivity and a mixer stage for down conversion of the radio frequency signal to an intermediate frequency (IF) as is known.

From the RF amplifier section the signal is coupled to an IF section that includes a step attenuator 107 that operates or is operable as a second attenuator stage operable to switch a second fixed amount of attenuation, nominally 18 dB, for the received signal. Such attenuators are known. Here a low noise amplifier that can be current starved is utilized in a preferred embodiment. From the step attenuator 107 the signal is coupled to an IF amplifier 109 that has variable or controllable gain and can be utilized as a variable attenuator, responsive to a variable control signal, to provide a variable amount of attenuation for the received signal as is known. From the IF amplifier the signal is split into in-phase or I and quadrature or Q components by known I and Q mixers 111, driven by a local oscillator signal, not shown with the resultant I and Q signals applied to base band filters (BBFs) 118 having responses corresponding to the type of signal being received again as known. The output signals from these BBFs are applied to, respective, analog to digital converters 115 that provide an RXI and RXQ signal that are preferably 8 bit signals.

The RXI and RXQ signals are applied or coupled to a signal input path 119 as well as a separate data processing path 117. The signal input path 119 is the beginning of an input stage or input section 120 of the AGC system and includes a high pass filter 123, specifically an infinite impulse response (IIR) filter having a corner frequency at least an order of magnitude and preferably 2–5 orders of magnitude higher than the corner frequency of corresponding IIR filters 121 in the data processing path. For example in the preferred form the corner frequency of the 1 pole IIR high pass filters 121 is nominally 10 Hz while the corner frequency for the 1 pole IIR high pass filters 123 is nominally 100 KHz. In the end the signal path for the AGC has greater low frequency rejection and higher resolution than the data path. This relative difference in corner frequency allows the present AGC systems to be utilized for so called zero IF or ZIF types or forms of receivers where the radio frequency signal is converted to or very near to a zero IF frequency, also known as direct conversion receivers.

Since the AGC system is a closed loop feedback system, DC or near DC components from the signal or from the various functional blocks, such as balanced mixers 111, can cause significant problems for the AGC systems. However, in many modulation schemes, such as WCDMA, these DC components from the signal are necessary to proper data processing, demodulation and so forth as is known plus this data processing is not a closed loop system so that undesired DC components will not have the same undesired impact or such impacts can be otherwise avoided. Rather than resort to extraordinary expense to fashion high performance mixers with exceptional balance and DC leakage specifications or alternatively highly selective IIR filters it has been found to be cost effective and otherwise advantageous to use separate AGC input signal and data processing paths beginning with the high pass filters for the AGC input versus data processing input paths.

The input section or stage of the AGC provides an indication of or corresponding to a strength or magnitude of the received signal that is being absorbed by the antenna 101. The input section or stage beyond and coupled to outputs of the high pass filters 123 may be thought of as a front end for the AGC system that includes a squaring function 125 that is basically two multipliers each with inputs coupled to the I and Q signals, as filtered, and outputs added together to provide an output signal corresponding to the square of the magnitude, thus energy, of the received signal. This signal is coupled to an AGC filter 127 that is preferably a finite impulse response (FIR) filter with an integrate time that is selectable and that provides an output signal, corresponding to the indication of signal strength of the received signal, that is normalized to a unit time, such as a chip time or multiple thereof regardless of a setting for the integrate time. Alternatively this filter can be arranged and constructed as an infinite impulse response filter. This may be advantageous when tracking received signals with a rapidly varying input level or strength, such as may be encountered under extreme fading conditions where the receiver is traveling at a high velocity with respect to a transmitter where the receive signal originated.

The output from the AGC filter 127 is coupled to and converted by a V2 to dB converter 129 to a digital signal in units, preferably of 0.125 dB. This conversion uses known techniques to perform this conversion such as the technique discussed in co-pending application titled SQUARING CIRCUIT AND ELECTRONIC DEVICE USING SAME by Hughes et al., filed May 30, 2000, bearing Ser. No. 09/583,645, assigned to the same assignee as here and hereby incorporated herein by reference. The output from the converter 129 is coupled to a compare and hysteresis block 131 that generally insures that magnitudes, directions, and hysteresis parameters are conformed with when responding to changes in the indication of signal strength. From there the signal is coupled to a scaling function or circuit 133 that scales the signal to a predetermined range or such that the indication is constrained to a first predetermined number of most significant bits, such as 11 and does so in an inventive fashion that on average eliminates any error resulting from the elimination of the least significant bits. This is accomplished by accumulating the least significant bits and adding them back to the signal or accumulating them and when the accumulation of sum of the least significant bits overflows or becomes significant adding the significant part back to the signal that is then scaled. The output of the scaling function or circuit is an indication of the strength or magnitude of the received signal and this is coupled to an automatic gain control (AGC) controller 135.

The AGC controller includes a state machine based or organized processor 147 and RSSI function 149. The AGC controller considers various states 146 or modes of operation of the receiver and AGC, such as track, mute, warm up, and suspend or sleep modes and is inter-coupled to the data processing path as well as the attenuators. In overview the AGC controller or controller is coupled to the front end or input section or stage 120 and responsive to the indication of signal strength or most significant bits as scaled and one or more other receiver conditions or modes to provide a gain control signal. The gain control signal more specifically includes a digital variable control signal, preferably a 10 bit digital signal that is coupled to a digital to analog converter 137 and converted to a variable control signal 145 that is coupled to the variable attenuator 109 or variable gain IF amplifier. The gain control signal further includes a switched control signal and preferably two such signals 141 and 143 with the switched control signal 143 coupled to the RF amplifier components or specifically bypass switch 105 and the second switched control signal coupled to the stepped attenuator 107 or second switched attenuator stage.

Continuing to refer to FIG. 1 the data processing path 117 includes the IIR high pass filters 121 that are coupled to a signal range shift function 151 as 9 bit digital words. The range shifter responsive to a signal 150 from the AGC controller 135 or processor 147 shifts the signal to a 6 bit range and this is applied to a data processing, demodulation, and decoder block 153 that is known and in a WCDMA embodiment does such things as demodulate the signal, despread or correlate the signal to a predetermined psuedo-random sequence and decode the despread signal with the aid of a signal 148 from the RSSI function, to provide data 157 for use and consumption as appropriate.

In FIG. 1 we have discussed and disclosed an automatic gain control system for a receiver for providing a wide range of continuous gain control that in one aspect is especially suited for providing a rapid response and accurate continuous gain control over a wide range of signal powers or strengths for a zero intermediate frequency receiver. The AGC system 100 in one aspect includes an input stage or section 119 for providing an indication of a strength of a received signal; an attenuator stage 103, 105 and preferably a second such stage 107 operable to switch a fixed amount and preferably second fixed amount of attenuation for the received signal. Further included is the variable attenuator 109 or IF amplifier that is responsive to a variable control signal at 145 to provide a variable amount of attenuation, ranging nominally from 32 dB of gain down to negative 25 dB of gain, for the received signal, and a controller or AGC controller 135.

The controller is responsive to the indication for providing the variable control signal and preferably switched control signals, such that the controller concurrently changes the variable control signal to change in the opposite direction the variable amount of attenuation by approximately the fixed amount or second fixed amount of attenuation whenever the attenuator stage or second attenuator stage is switched either in or out, off or on, etc, thereby extending the range of continuous gain control beyond the range of the variable attenuator. Furthermore the controller is operable to enable and disable the switched or second switched control signal in order to provide hysteresis relative to the strength of the receive signal for switching the fixed attenuation in versus out. Stated in another way, the AGC controller or controller utilizes the gain control signal to control the plurality of attenuator stages to effect gain replacement by switching a fixed attenuation while concurrently changing a variable attenuation in an opposite direction by an amount approximating the fixed attenuation thereby providing continuous gain control and this is a distinct advantage for receiving complex modulation high data rate signals. In sum the controller cooperatively controls the attenuator stage, the second attenuator stage and the variable attenuator to provide a range of continuous gain control including the fixed amount, the second fixed amount and a variable range.

Figure 2:
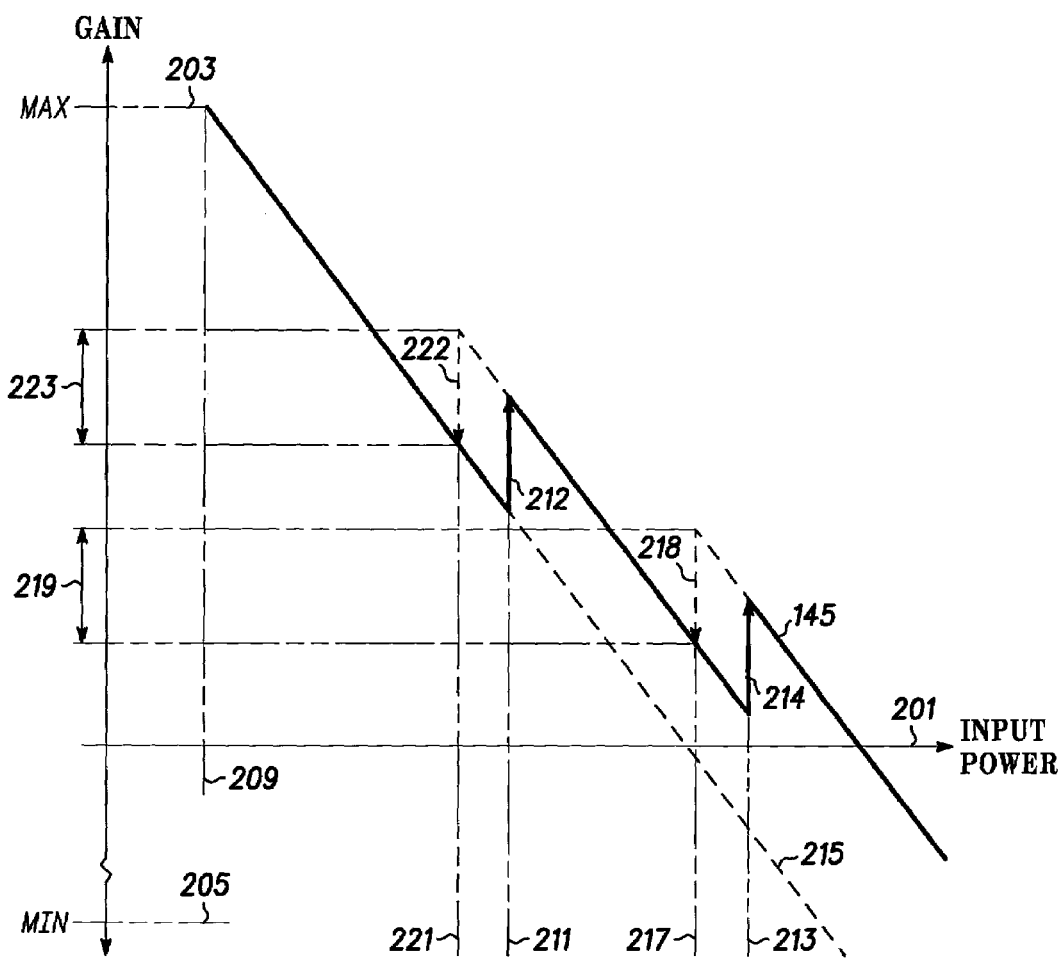
FIG. 2 shows a graph of simulated performance for the AGC system of FIG.

These concepts and principles involving gain replacement will be discussed and explained further with reference to FIG. 2 where a graph of simulated performance for the AGC system is depicted. FIG. 2 shows relative gain or reduction in gain on the vertical axis as a function of input power or signal level at the antenna 201 on the horizontal axis. The solid line is an exemplary depiction of the variable control signal 145 that is applied to the variable attenuator or variable gain IF amplifier 109. As the input signal level or strength increases the gain is reduced from a maximum gain 203 to a minimum gain 205 or the attenuation is increasing.

As the signal strength increases a threshold 209 is encountered where the AGC begins acting to reduce the gain and the variable control signal begins to decrease.

At 211 the first fixed attenuator is activated switching in fixed attenuation and as noted the variable control signal increases by the amount 212 thus reducing the amount of attenuation provided by the variable attenuator by an amount approximating or just less than the amount of fixed attenuation due, preferably to the stepped attenuator 107 being activated. As the input signal strength continues to increase at 213 the second stage of fixed attenuation is activated or enabled and the variable control signal is increased by an amount 214 thus effecting gain replacement that approximates the amount of the fixed attenuation due to the RF amplifier 103 being bypassed by the switch 105. Dashed line 215 depicts the overall gain reduction or attenuation. While not shown, Note that once the maximum gain reduction or attenuation from all attenuators has been applied the various signals throughout the AGC signal path and data processing path will increase linearly with the signal strength at the antenna.

In reverse as the signal strength is decreased from a high level the point 217 is encountered where the second stage of attenuation is switched out or disabled and the variable attenuation is increased by a corresponding amount as indicated by the reduction in the variable control signal at 218 thus effecting gain replacement 219 in reverse. Note also that this attenuation stage is disabled at a smaller signal strength than where enabled thus effecting some hysteresis approximated by the difference between 213 and 217. As the signal strength continues to drop to 221 the first stage is disabled and the variable control signal drops by an amount 222 to just compensate for the additional gain thus effecting gain replacement 223 in reverse and again hysteresis is demonstrated as the difference between 211 and 221.

Figure 3:
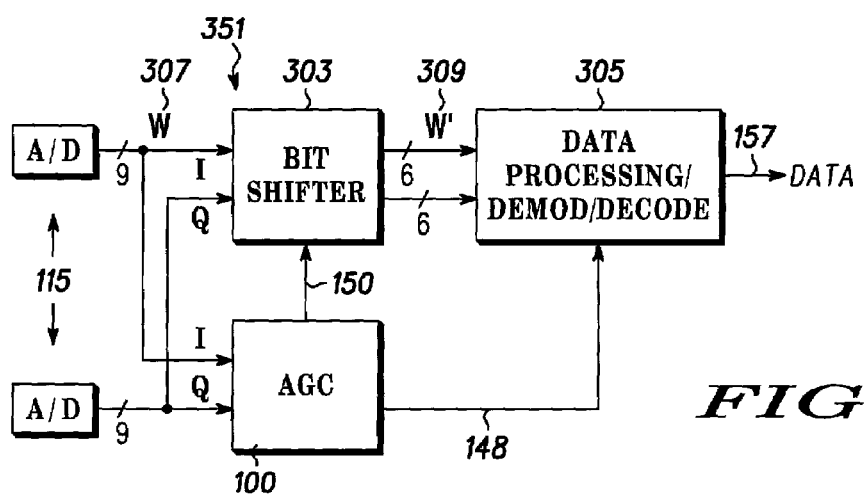
FIG. 3 illustrates a block diagram of a first embodiment of a signal shifter portion of the AGC system of FIG. 1 according to the present invention.
Figure 4:
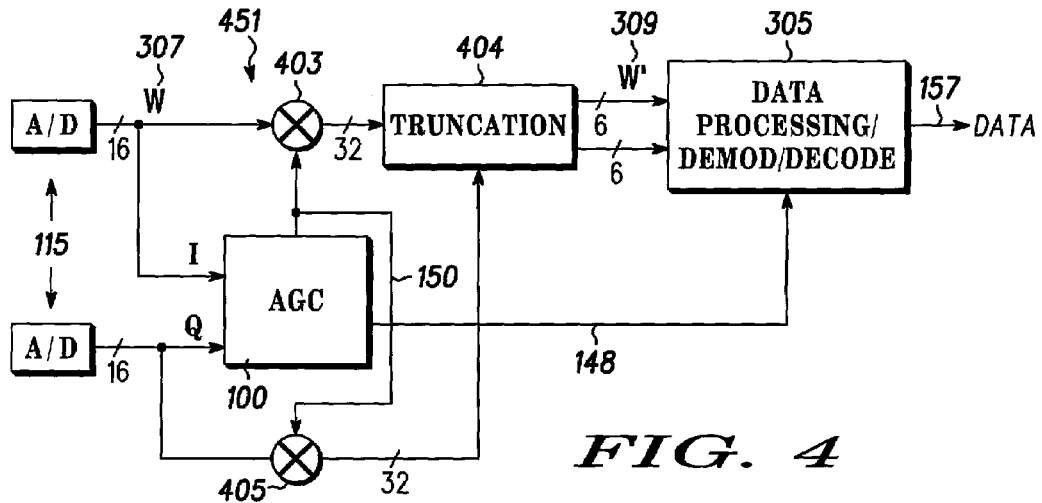
FIG. 4 illustrates a block diagram of a second embodiment of a signal shifter portion of the AGC system of FIG. 1 according to the present invention.

Referring to FIG. 3 and FIG. 4 alternative embodiments for the signal shifter 151 will be discussed. FIG. 3 shows a signal shifter 351 coupled to the A/D converters 115 with W bit wide busses 307, here 9 bits. RXI and RXQ signals from the converters (IIR high pass filters 121 not specifically depicted) are coupled to the signal shifter, specifically a bit shifter 303, as well as AGC system 100. The AGC system or specifically the AGC controller 135 provides the control signal 150, responsive to the indication of signal strength, which is coupled to the signal shifter 303 in the data processing path 117. Responsive to the control signal, essentially an indication of how many bits to shift the input I and Q signals, the signal shifter shifts the receive signal to provide a shifted receive signal that remains within an input range W' 309 of the data signal processor 305, where this input range is constrained to be smaller than the range of the receive signal W or as here depicted W' is a 6 bits wide buss. Typically bits having less significance that do not fit within the selected range or range of the data processing unit once shifted are dropped. Often W' in practice will be the most significant bits in a shift register with parallel outputs but can as well be a selected number of bits where upper and lower bits are discarded.

Note that this is feasible given that the receive signal, notwithstanding the AGC system, will still vary in amplitude or strength by a significant amount (eg over a 120 dB signal power variation the receive signal at the output of the A/D converters will nominally vary 30 dB) implying that the number of bits resolution at the output of the A/D converters will need to account for this variation. At the same time the variation of the signal amplitude needed to resolve signal variation due to modulation will not be expected to vary nearly as much and thus fewer bits will be required to uniquely resolve this variation. This range shifting and dropping of insignificant bits is desirable given that power consumption and processing circuit complexity, space, and cost are significantly dependent on the number of bits that need to be processed in parallel.

Other contemplated embodiments may have even wider busses as inputs to the signal shifter. For example, FIG. 4 depicts an alternative embodiment of a signal shifter 451 with W bit wide busses 307 of 16 bits. The FIG. 4 signal shifter 451 coupled to the A/D converters 115 with W bit wide busses 307, here 16 bits. RXI and RXQ signals from the converters (IIR high pass filters 121 not specifically depicted) are coupled to the signal shifter, specifically digital multipliers 403, 405, as well as AGC system 100. The AGC system or specifically the AGC controller 135 provides the control signal 150, responsive to the indication of signal strength, which is coupled to the digital multipliers 403, 405 in the data processing path 117. Responsive to the control signal, essentially an indication of how many bits to shift the input I and Q signals, the signal shifter by multiplying the I and Q signals by an up to 16 bit control signal shifts the receive signal to provide a 32 bit shifted receive signal, the significant portion of which remains within an input range W' 309 of the data signal processor 305, where this input range is constrained to be smaller than the range of the receive signal W or as here depicted W' is a 6 bits wide buss. The two, up to 32 bit wide, signals from the multipliers 403, 405 are coupled to a truncation element 404 where the bits having less significance that do not fit within the selected range or range of the data processing unit once shifted are truncated or dropped and the balance or significant bits W', here 6 bits, are coupled to the data processing function 305. Note that in FIG. 3 and FIG. 4 the AGC system also provides an indication of signal strength 148 to the data processing element 305 that facilitates data processing as is known. One alternative approach to the range shifting function that is not depicted is coupling the output from each multiplier to a digital filter and using the output of these filters as the control signal 150. Regardless of the embodiment and in addition to the power savings and processing complexity saved with the bit or buss width reduction this scaling approach for the data processing path effectively extends the AGC control range for the overall data receiver.

Figure 5:
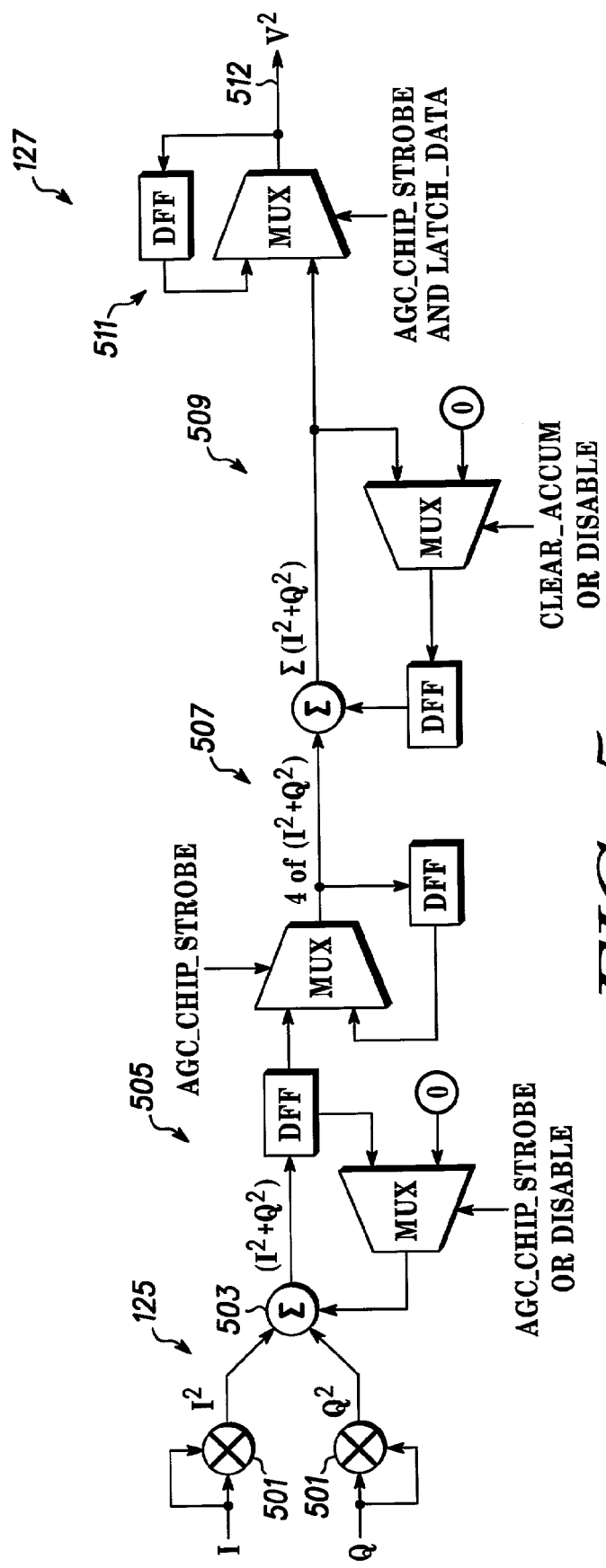
FIG. 5 shows a block diagram of a preferred embodiment of a FIR filter portion of the FIG. 1 AGC system according to the present invention.

Referring to FIG. 5, a block diagram of a preferred embodiment of a squaring function and a Finite Impulse Response (FIR) filter portion of the FIG. 1 AGC system will be discussed and described. With reference to FIG. 1 we noted that the automatic gain control system or front end thereof included a squaring function 125. Thus squaring function, element or circuit 125, preferably includes a multiplier or as here depicted two multipliers 501, that are coupled to the outputs I and Q of the high pass filters 123 for providing to a finite impulse response filter 127 a signal corresponding to a square of the receive signal. Each multiplier multiplies the input signal, I or Q by itself to provide, respectively, $I^2$ and $Q^2$ and these are summed together at summer 503 along with the output of a mux to provide $I^2+Q^2$.

The mux is part of the accumulate and dump or FIR filter 127 that is included in the automatic gain control system or front end thereof that has an integrate time that is selectable for providing an output signal that is normalized (see FIG. 6 and discussions thereof) to a unit time regardless of the setting for the integrate time. The sum, $I^2+Q^2$, represents the instantaneous magnitude squared of the total data stream.

The clock rate at this stage is 4 times the channel symbol rate or 4 times the chip rate in an exemplary WCDMA receiver (4×3.84 Mcps). Four of these instantaneous magnitude squared values are accumulated together at 505 to form one "CHIP" worth of data. AGC_CHIP_STROBE occurs at the chip rate and synchronizes the passing of 4 sums or 4 ($I^2+Q^2$) values or one "CHIP" worth of data via 507 while 505 is reset or cleared. This decimated "CHIP" worth of data is then "filtered" or accumulated at 509. Not shown but well within the capability of one of ordinary skill given the disclosure here is a timing block that contains a CHIP rate down counter, which measures the amount of time to accumulate or integrate time before dumping. The counter is loaded with the selectable integrate time, preferably an integer number of chips such as 38, 153, 615, or a user selected number. CLEAR_ACCUM gets set when the counter counting down at the chip rate reaches 0, causing the accumulator section at 509 to clear and the AGC chip strobe and latch data (same as CLEAR_ACCUM so long as data is deemed valid) trigger the mux at 511 to pass the accumulated data to $V^2$ 512.

The duration of this final step is controlled by the user's selection of bandwidth (#CHIPs) as noted above. This selectable bandwidth or integrate time is advantageously used by the AGC system to quickly acquire proper gain settings, for example during a warm up cycle where the receiver is initially powered up and is attempting to acquire a channel and establish the proper gain settings. After initial acquisition the AGC system can conserve power by operating at a lower bandwidth (e.g. less frequent updates) and the # of chips or integrate time can then be lengthened.

The AGC system is a negative feedback circuit, and thus it can suffer from loop dynamics such as instability, overshoot, and undershoot. To minimize this, when the AGC system switches a step attenuator and the variable gain IF amplifier is updated with a corresponding and opposite gain change, the AGC system waits 30 data units or for WCDMA 30 chips before taking a new measurement (DELAY TIME). During this wait state, the AGC filter is cleared and reset. This wait state allows any perturbation of the signal caused by the AGC system changes to propagate through the system. This ensures that the next new measurement cycle for the AGC detector will be based on clean data and the feedback system remains stable. This allows the AGC bandwidth to be faster than previous or prior art AGC systems.

This is especially advantageous as typically AGC bandwidths on zero IF architectures are low due to problems caused by inherent injected transients such as amplifier and mixer gain-induced DC offsets. AGC systems that allow these transients to be integrated by the AGC loop take even longer to clear the disturbances from the system. This AGC wait state time can be advantageously modified to fit any systemic perturbation and corresponding propagation delay. Though not depicted the AGC filter can also be configured as an IIR filter as above noted. One of ordinary skill in view of the discussion herein will be prepared to re-configure this filter. As noted above the IIR filter may have response time advantages when tracking rapidly varying signal strengths. Because of the rapid and unconstrained response, the IIR filter may also suffer more from irregularities due to perturbations within the system such as those noted above.

Figure 6:
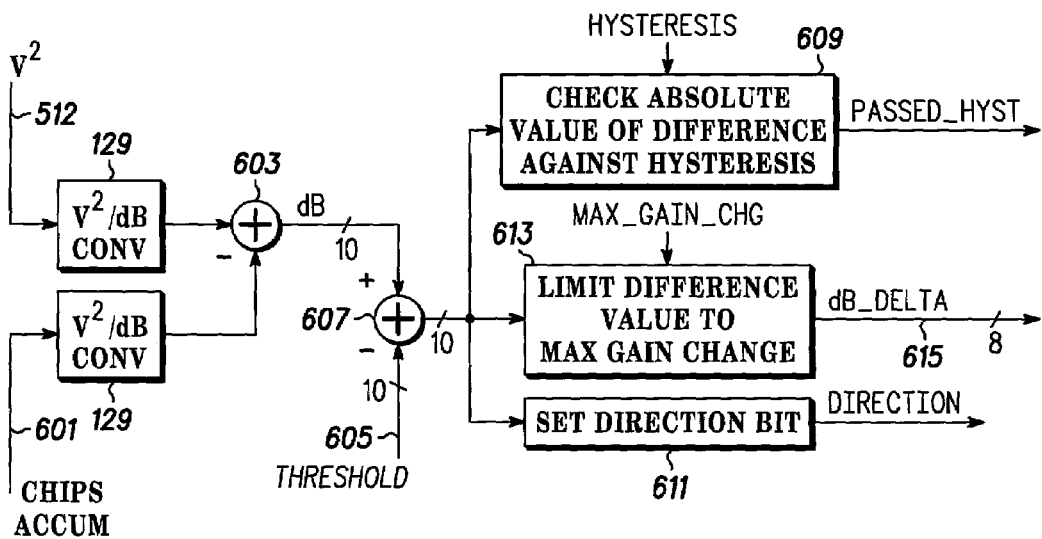
FIG. 6 depicts a block diagram of an embodiment of a conversion, comparison and hysteresis portion of the FIG. 1 AGC system according to the present invention

Referring to FIG. 6 a block diagram of an embodiment of a conversion, comparison and hysteresis portion of the FIG. 1 AGC system will be discussed. Initially $V^2$ is normalized to a unit time, such as a chip time for WCDMA receivers or perhaps another channel symbol for other forms of receivers.

This normalization function can be performed by the filter of FIG. 5 but has been shown here in an alternate preferred embodiment as part of the converter 129. $V^2$ 512 is converted to a dB representation together with a number of chips accumulated signal 601, where the latter corresponds to the selectable integrate time discussed above, by converters 129. The dB representation for the number of chips is subtracted from the dB representation of $V^2$ at adder 603. Note that subtraction in dB is equivalent to division in normal numbers. Thus the output signal from the FIR filter is normalized to a unit time, here chip time, regardless of the setting for the integrate time. Note further that this embodiment may be preferred because dB converters and adders are simpler to construct and more space and power efficient than multipliers that are required for division.

The output from the adder is an indication of the signal strength of the received signal that is applied to adder 607 together with a threshold value 605. The threshold value is selected and programmed such that the AGC begins operation at the threshold 209 in FIG. 2. Note that since the output from the adder has been normalized this threshold value does not need to be updated each time the integrate time or bandwidth of the FIR or AGC filter is changed. The output of the adder 607 is coupled to a hysteresis block 609 where the present indication is compared to the indication when a fixed attenuator was switched to insure that appropriate hysteresis conditions are met. These conditions can be selected and input to this processing block as indicated. If the hysteresis conditions are satisfied the output signal PASSED_HYST is set thereby enabling the controller to provide the control signals including switched as required. The output from the adder 607 is also coupled to the direction block 611 and the DIRECTION signal takes one value if the output is increasing and another if decreasing. The indication of signal strength in dB terms is also coupled to a limiting block 613 which limits the max change for this indication to a selectable MAX_GAIN_CHG value and outputs the indication as a dB_delta signal 615.

Figure 7:
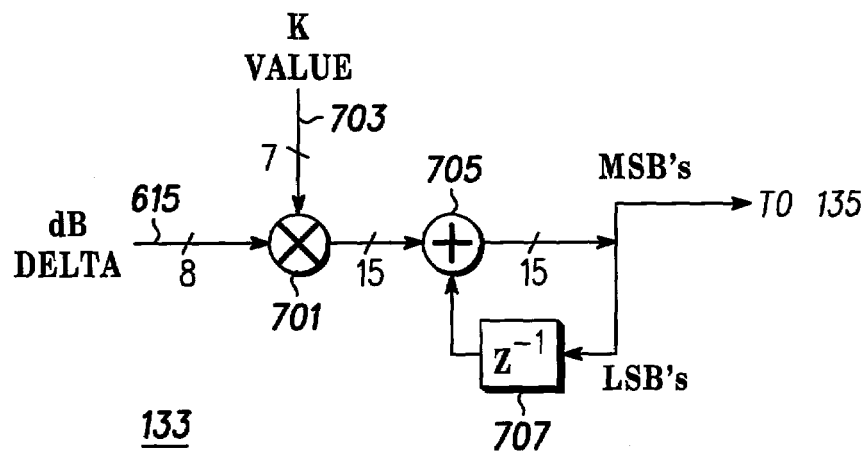
FIG. 7 shows a block diagram of a preferred embodiment of a scaling function portion of the AGC system of FIG. 1 according to the present invention.

Referring to FIG. 7 a block diagram of a preferred embodiment of a scaling function portion 133 of the AGC system of FIG. 1 will be discussed and described. As was noted briefly above the front end of the AGC includes or operates in conjunction with a scaling circuit or element for scaling a signal corresponding to the output signal from the AGC filter whether the finite impulse response filter or infinite impulse response filter is selected to provide the indication of signal strength to the controller, where this indication is constrained to a first predetermined number of most significant bits. The scaling circuit further includes an accumulator or a circuit operating as an accumulator for accumulating least significant bits and combining the least significant bits with the scaled signal corresponding to the output signal from the finite impulse response filter thereby on average eliminating any error resulting from dropping least significant bits. Scaling the signal increases the sensitivity of the AGC loop to small changes in the indication of signal strength that may help in acquisition times. Note that the scaling circuit or specifically error correction techniques as discussed here may be more advantageous when the AGC filter is an IIR filter. This is because, as is known, this filter incorporates significantly more history within the underlying processing and therefore even small errors can build up to significant problems. By the same reasoning when longer integrate times or narrower bandwidths are chosen for FIR filter this error correction scheme will be more helpful than otherwise, due to the fact as we earlier noted that the FIR filter is zeroed out or reset at the end of each integrate time.

More specifically the indication of signal strength, referred to as dB_delta 615 is coupled as an 8 bit wide signal to a multiplier 701 together with a 7 bit wide scaling factor 703 or K value where the K value is programmable. The output of the multiplier is a scaled indication of signal strength that is a 15 bit wide signal that is coupled to an adder 705 together with an error signal from one clock time delay 707. The adder adds together the scaled indication and the error signal to provide a corrected scaled indication that is separated into most significant bits, preferably 11 bits, and least significant bits, preferably 4 bits, where the least significant bits are coupled to the adder 705 through the one clock delay 707 as the error signal. In this fashion the signal bit width is constrained thereby helping with downstream complexity and power consumption and on average whatever error may be caused by dropping the least significant bits is corrected. Since the AGC system is closed loop this is important as even small errors can eventually add up to large problems. As an alternative to the time delayed version of the error signal being coupled to the adder and allowed to continue to grow within the loop an accumulator may be coupled to the least significant bits and operate to add and accumulate the least significant bits until a result is a most significant bit and then couple this most significant bit to the adder as the error signal.

Figure 8:
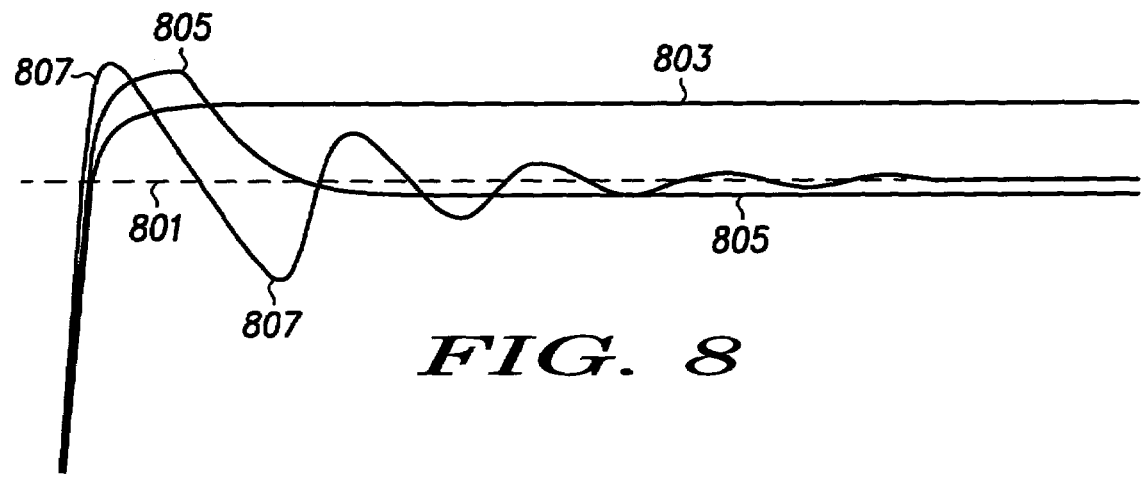
FIG. 8 depicts a performance simulation of the scaling function of FIG. 7 as compared to various alternatives.

Referring to FIG. 8 a performance simulation of the scaling function or operation described above with reference to FIG. 7 as compared to various alternatives will be described and discussed. The alternatives considered were dropping the least significant bits and rounding the least of the most significant bits in accordance with the least significant bits. FIG. 8 depicts how quickly and how closely the various approaches come to the desired value or here threshold 801. By observation the least significant bit dropping approach 803 never approached the threshold value. The rounding technique 805 yielded better results but still ended up below the threshold value. The scaling approach with the correction technique 807 discussed above is equal to or nearly equal to the threshold with a longer acquisition time. It turns out that the acquisition time is still well within reasonable objectives so the best performance appears to be the above discussed correction technique.

An automatic gain control system for a receiver that is arranged and constructed to provide a fast acting wide range and accurate continuous gain control for complex modulation high data rate receivers such as WCDMA receivers including zero IF versions thereof has been discussed and described. Generally the automatic gain control advantageously uses gain replacement techniques to effect wide range continuous gain control and separate AGC signal paths and data paths plus scaling and the like to effect the fast acting accurate gain control. The AGC controller in addition to considering an indication of signal strength also exercises control over the various elements of the AGC system in view of other considerations such as whether the AGC is in a tracking or functional mode, or whether the receiver is muted, going through a warm up sequence or whether operation of the receiver and AGC has been suspended, such as for programming and the like.

The processes, discussed above, and the inventive principles thereof are intended to and will alleviate problems caused by prior art automatic gain control systems and methodologies, particularly when applied to receivers for complex modulation high data rate signals. Using these principles and concepts will enable and facilitate development of accurate, fast acquisition wide range continuous gain control systems that are power conscious and space efficient.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. An automatic gain control system for a receiver for providing a wide range of continuous gain control, the automatic gain control system comprising in combination:
    an input stage for providing an indication of a strength of a received signal;
    an attenuator stage operable to switch a fixed amount of attenuation for said received signal;
    a variable attenuator, responsive to a variable control signal, to provide a variable amount of attenuation for said received signal, and
    a controller responsive to said indication for providing said variable control signal; wherein said controller concurrently changes said variable control signal to change in the opposite direction said variable amount of attenuation by approximately said fixed amount of attenuation whenever said attenuator stage is switched, thereby extending the range of continuous gain control beyond the range of the variable attenuator.

2. The automatic gain control system of claim 1 wherein said input stage includes a signal path that is separate from the data processing path in a zero intermediate frequency receiver said signal path having greater low frequency rejection and a higher resolution than said data path.

3. The automatic gain control system of claim 1 wherein said controller further provides a variable digital control signal that is converted to said variable control signal.

4. The automatic gain control system of claim 1 wherein said attenuator stage is switched responsive to a switched control signal that is provided by said controller.

5. The automatic gain control system of claim 4 wherein said controller is operable to enable and disable said switched control signal in order to provide hysteresis relative to said strength of said receive signal for switching said fixed attenuation in versus out.

6. The automatic gain control system of claim 4 further including a second attenuator stage operable to switch a second fixed amount of attenuation for said received signal responsive to a second switched control signal provided by said controller; wherein said controller changes said variable control signal to change, in the opposite direction, said variable amount of attenuation by approximately said second fixed amount of attenuation whenever said second attenuator stage is switched.

7. The automatic gain control system of claim 6 wherein said controller cooperatively controls said attenuator stage, said second attenuator stage and said variable attenuator to provide a range of continuous gain control including said fixed amount, said second fixed amount and a variable range.

8. An automatic gain control system for a zero intermediate frequency receiver for providing a rapid response and accurate continuous gain control over a wide range, the automatic gain control comprising in combination:
    a signal input path separate from a data processing path and having a high pass filter with a corner frequency at least an order of magnitude higher than the data processing path;
    a front end, coupled to an output of said high pass filter, for providing an indication of a strength of a received signal;
    an AGC controller coupled to said front end and responsive to said indication and one or more other receiver conditions to provide a gain control signal; and
    a plurality of attenuator stages, responsive to said gain control signal, for providing continuous gain control over a combined range of attenuation of said attenuator stages.

9. The automatic gain control system of claim 8 wherein said AGC controller utilizing said gain control signal to control said plurality of attenuator stages to effect gain replacement by switching a fixed attenuation while concurrently changing a variable attenuation in an opposite direction by an amount approximating said fixed attenuation thereby providing said continuous gain control.

10. The automatic gain control system of claim 8 wherein said AGC controller further provides a control signal coupled to a signal shifter in said data processing path that, responsive to said control signal, shifts said receive signal to provide a shifted receive signal that remains within an input range of a data signal processor, said input range constrained to be smaller than a range of said receive signal.

11. The automatic gain control system of claim 8 wherein said signal shifter is one of a bit shifter and a digital multiplier responsive to said control signal.

12. The automatic gain control system of claim 8 wherein said front end further includes a finite impulse response filter with an integrate time that is selectable for providing an output signal that is normalized to a unit time regardless of a setting for said integrate time.

13. The automatic gain control system of claim 12 wherein said front end further includes a multiplier, coupled to said output of said high pass filter for providing to said finite impulse response filter a signal corresponding to a square of said receive signal.

14. The automatic gain control system of claim 13 wherein said front end controller further includes a scaling circuit for scaling a signal corresponding to said output signal from said finite impulse response filter to provide said indication, said indication constrained to a first predetermined number of most significant bits and an accumulator for accumulating least significant bits and combining said least significant bits with said signal corresponding to said output signal from said finite impulse response filter.

15. An automatic gain control system for a receiver arranged and constructed to provide a wide range and accurate continuous gain control, the automatic gain control comprising in combination:
    an input section for providing an indication of a strength of a received signal;
    a multiplier for multiplying said indication by a scaling factor, to provide a scaled indication corresponding to said indication;

an adder for adding said scaled indication and an error signal to provide a corrected scaled indication said corrected scaled indication separated into most significant bits and least significant bits, said least significant bits coupled to said adder as said error signal an AGC controller coupled to said most significant bits of said corrected scaled indication to provide a gain control signal; and a plurality of attenuator stages, responsive to said gain control signal, for providing continuous gain control over a combined range of attenuation of said attenuator stages.

16. The automatic gain control system of claim 15 wherein said AGC controller utilizing said gain control signal to control said plurality of attenuator stages to effect gain replacement by switching a fixed attenuation while concurrently changing a variable attenuation in an opposite direction by an amount approximating said fixed attenuation thereby providing said continuous gain control.

17. The automatic gain control system of claim 15 wherein said AGC controller further provides a control signal coupled to a signal shifter in a data processing path that, responsive to said control signal, shifts said receive signal to provide a shifted receive signal that remains within an input range of a data signal processor, said input range constrained to be smaller than a range of said receive signal.

18. The automatic gain control system of claim 15 further including an accumulator coupled to said least significant bits for adding and accumulating said least significant bits until a result is a most significant bit and coupling said most significant bit to said adder as said error signal.

19. The automatic gain control system of claim 15 wherein said input section further includes a multiplier, coupled to said receive signal for providing a signal corresponding to a square of said receive signal.

20. The automatic gain control system of claim 19 wherein said input section further includes a finite impulse response filter, coupled to said signal corresponding to a square of said receive signal, with an integrate time that is selectable for providing an output signal that is normalized to a unit time regardless of a setting for said integrate time, said output signal corresponding to said indication.

* * * * *

UNITED STATES PATENT AND TRADEMARK OFFICE
CERTIFICATE OF CORRECTION

PATENT NO. : 7,184,730 B2　　　　　　　　　　　　　　　　　　　　　　　Page 1 of 1
APPLICATION NO. : 10/138681
DATED : February 27, 2007
INVENTOR(S) : Hughes et al.

It is certified that error appears in the above-identified patent and that said Letters Patent is hereby corrected as shown below:

Column 10 line 39 please delete "thereby extending" and insert --to extend--
Column 10 line 43 please delete "the" and insert --a--
Column 12 line 34 after "input" please insert "amplitude"
Column 12 line 35 after "input" please insert "amplitude"
Column 12 line 36 after "input" please insert "amplitude"

Signed and Sealed this

First Day of May, 2007

JON W. DUDAS
*Director of the United States Patent and Trademark Office*